(12) United States Patent
Maeda et al.

(10) Patent No.: US 7,495,296 B2
(45) Date of Patent: Feb. 24, 2009

(54) SEMICONDUCTOR INTEGRATED CIRCUIT DEVICE

(75) Inventors: Eisaku Maeda, Takatsuki (JP); Akihiro Maejima, Takatsuki (JP); Hiroki Matsunaga, Takatsuki (JP); Jinsaku Kaneda, Suita (JP); Masahiko Sasada, Fushimi-ku (JP)

(73) Assignee: Panasonic Corporation, Osaka (JP)

( * ) Notice: Subject to any disclaimer, the term of this patent is extended or adjusted under 35 U.S.C. 154(b) by 106 days.

(21) Appl. No.: 11/139,590

(22) Filed: May 31, 2005

(65) Prior Publication Data
US 2005/0263910 A1 Dec. 1, 2005

(30) Foreign Application Priority Data
Jun. 1, 2004 (JP) ............................ 2004-163700

(51) Int. Cl.
*H01L 29/94* (2006.01)
(52) U.S. Cl. .................. 257/401; 257/390; 257/394; 257/786; 257/E29.029; 257/E29.064; 365/100; 365/148; 365/189.05
(58) Field of Classification Search .............. 257/394, 257/401, 786
See application file for complete search history.

(56) References Cited

U.S. PATENT DOCUMENTS 5,682,048 A * 10/1997 Shinohara et al. ............ 257/342
6,140,687 A * 10/2000 Shimomura et al. ......... 257/401

FOREIGN PATENT DOCUMENTS

JP 3-195045 8/1991

* cited by examiner

*Primary Examiner*—Dao H Nguyen
(74) *Attorney, Agent, or Firm*—Wenderoth, Lind & Ponack, L.L.P.

(57) ABSTRACT

The present invention relates to a layout of a multi-channel semiconductor integrated circuit and provides a layout of a semiconductor integrated circuit having ternary circuits in order to increase a degree of integration in the semiconductor integrated circuit and stabilize output characteristics. A ternary circuit is formed by arranging a second high-side transistor, a diode, a second level shift circuit on one hand, and a low-side transistor, a first high-side transistor, a first level shift circuit, and a pre-driver on the other, so that each of cells are arranged in a row and an output bonding pad is placed between the second high-side transistor and the low-side transistor, wherein a cell width of the first level shift circuit, second level shift circuit and pre-driver corresponds to a cell width of the low-side transistor.

20 Claims, 7 Drawing Sheets

SEMICONDUCTOR INTEGRATED CIRCUIT DEVICE

BACKGROUND OF THE INVENTION (1) Field of the Invention

The present invention relates to a semiconductor integrated circuit that includes: output transistors; and an output bonding pad connected to an output signal wire drawn from each of the output transistors, and also relates to a multi-channel semiconductor integrated circuit in which semiconductor integrated circuits are set in an array, each of which serves as a standard cell. The present invention particularly relates to a layout of the semiconductor integrated circuit that performs binary or ternary output, and a layout of the multi-channel semiconductor integrated circuit.

(2) Description of the Related Art

Figure 7:
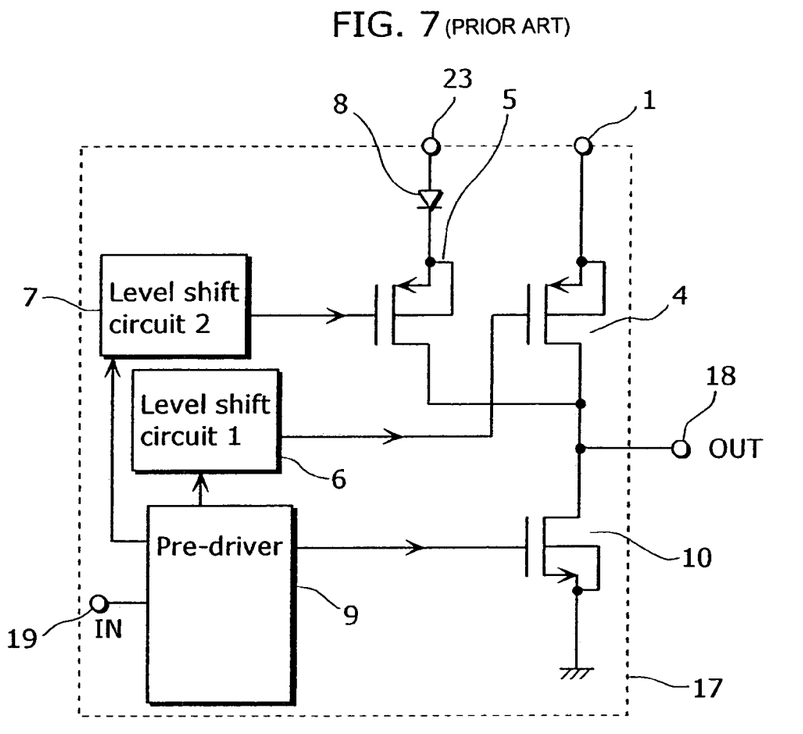
FIG. 7 is a circuit diagram showing a structure of a semiconductor integrated circuit based on a ternary circuit.

A ternary circuit is conventionally known as a circuit shown in FIG. 7. The ternary circuit shown in this figure includes: a first high-side transistor 4 for high-level output; a second high-side transistor 5 for middle-level output; a backflow preventing diode 8; a low-side transistor 10 for low-level output; a first level shift circuit 6 that outputs a high-level output control signal; a second level shift circuit 7 that outputs a middle-level output control signal; a pre-driver 9 that controls the first and second level shift circuits 6 and 7 and the low-side transistor 10; a first-high voltage terminal to which a high-level voltage is applied from an exterior; a secondly-high voltage terminal to which a middle-level voltage is applied from the exterior; and an input terminal 19 for respectively providing an output terminal 18 and the pre-driver 9 with a trigger signal.

Figure 8:
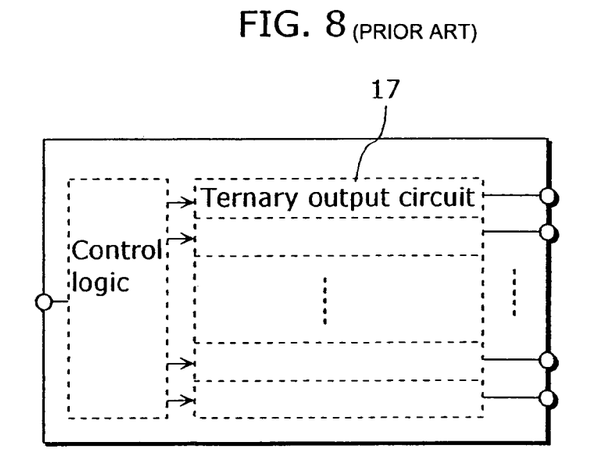
FIG. 8 shows a structure of a multi-channel semiconductor integrated circuit based on a ternary circuit.

FIG. 8 is a block diagram showing a structure of a multi-channel semiconductor integrated circuit where the ternary circuit shown in FIG. 7 serves as a standard cell. As shown in this figure, the multi-channel semiconductor integrated circuit consists of plural standard cells and a control logic that controls the standard cells. The control logic controls the pre-driver 9 in each of the standard cells for controlling sequential output from the plural standard cells.

Figure 5:
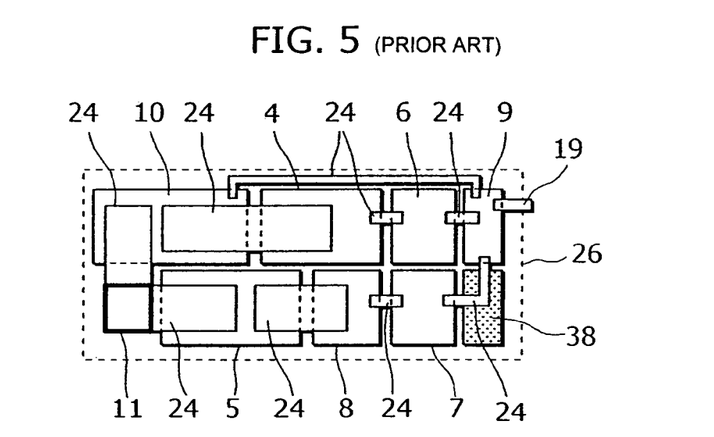
FIG. 5 is a plan view showing a structure of a conventional semiconductor integrated circuit.

FIG. 5 is a diagram showing a layout of the ternary circuit shown in FIG. 7 on a semiconductor chip. As can be seen in the ternary circuit shown in this figure, the low-side transistor 10, the first high-side transistor 4, the first level shift circuit 6 and the pre-driver 9 are placed in a first row, while an output bonding pad 11, the second high-side transistor 5, the diode 8 and the second level shift circuit 7 are placed and wired in a second row. Components of the ternary circuit are placed in two rows so that a length of each wiring for a flow of a signal inputted and outputted at high-level, middle-level and low-level, becomes almost the same.

Figure 6:
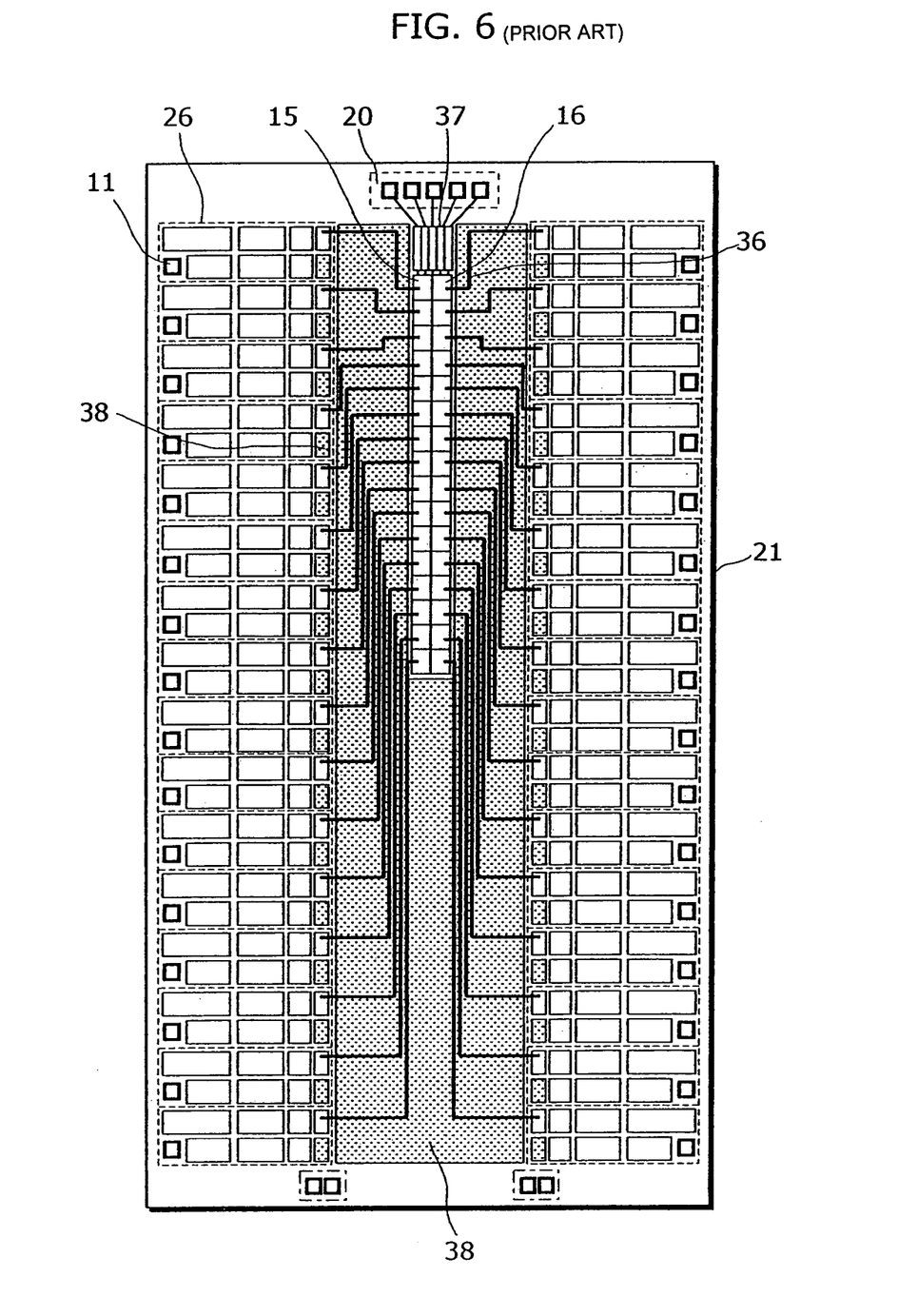
FIG. 6 is a plan view showing a structure of a conventional ternary multi-channel semiconductor integrated circuit.

FIG. 6 is a layout of a multi-channel semiconductor integrated circuit on the semiconductor chip shown in FIG. 8. The multi-channel semiconductor integrated circuit on the semiconductor chip disclosed in the Japanese Laid-Open Application 3-195045 (see reference to FIG. 3A) is as shown in FIG. 6. In FIG. 6, the ternary circuit shown in FIG. 7 serves as a standard cell, and plural standard cells 26 are vertically aligned in two rows, with each output bonding pad 11 placed on an outer side of semiconductor chip 21. Between the two rows, a timing generation block 15 is placed. The timing generation block 15 is made up of two rows of timing generation unit cells 16, with each row being as many as a number of the standard cells 26.

The timing generation block 15 functions, for example, as a shift register for controlling a timing of a trigger signal to each pre-driver 9 and a timing of an output from each standard cell, according to a control signal outputted from an input control terminal 20. The output from each of the timing generation unit cells 16 is connected, via a bus wiring 36, to the input terminal 19 in a corresponding standard cell 26. In this case, each of the standard cells 26 sequentially outputs a pulse waveform as triggered by a shift operation performed by the timing generation block 15. Also, a surge protection device 37 that forms a path to discharge surge and electrostatic noise in order to protect internal circuits is set in the input control device 20.

According to the layout shown in FIG. 5, the ternary circuit has a two-row structure in which the low-side transistor 10, the first high-side transistor 4, the first level shift circuit 6 and the pre-driver 9 are placed in the first row while the output bonding pad 11, the second high-side transistor 5, the diode 8 and the second level shift circuit 7 are placed in the second row. Therefore, in a case where high-voltage and heavy-current are required as output characteristics of the ternary circuit, a problem is that a planar dimension of a single standard cell that includes the output transistors and level shift circuits gets larger and a size of a free space 38 beneath the pre-driver 9 in the ternary circuit increases, which leads to a decrease in a degree of integration in the circuit.

As for the multi-channel semiconductor integrated circuit shown in FIG. 6, it has recently been demanded that the degree of integration be increased so that one semiconductor chip can include more output channels. In a case of using the ternary circuit shown in FIG. 5 as the standard cell 26, the more the number of the standard cells 26 to be placed in one semiconductor chip increases, the more the planar dimension of the semiconductor chip increases in a vertical direction. However, a width of the timing generation unit cell 16 in the timing generation block 15 that drives a standard cell 26 is smaller than a width of the standard cell 26. Therefore, in a case of applying the conventional layout as shown in FIG. 6 to the standard cell 26 and the timing generation block 15 in the multi-channel semiconductor integrated circuit, a large unnecessary free space 38 is generated beneath the timing generation block 15 within the semiconductor integrated circuit, as a result. This decreases the degree of integration in the semiconductor integrated circuit.

Due to a difference in a length of the bus wiring 36, which is laid between the timing generation unit cell 16 and the pre-driver 9 in each standard cell 26, the length of the bus wiring 36 gets longer as a degree of integration gets higher, and a wiring capacitance and a delay time in transferring a signal increase accordingly. As a result, unbalance is generated among output characteristics (delay time in particular) of the ternary circuits depending on the length of the bus wiring 36 that connects the timing generation unit cell 16 and the pre-driver 9.

SUMMARY OF THE INVENTION

The present invention is conceived in view of the above problems, and an object of the present invention is to provide a semiconductor integrated circuit and a multi-channel semiconductor integrated circuit which respectively have a suitable layout for increasing a degree of integration in an output circuit that serves as a standard cell and in the multi-channel semiconductor integrated circuit, and reducing unbalance among output characteristics of such output circuits.

In order to achieve the above object, a semiconductor integrated circuit according to the present invention includes: a first output transistor which is formed in a surface portion of a semiconductor substrate, and includes a first source electrode and a first drain electrode located in a first metallic layer, with one of the first source electrode and first drain electrode having one or more partial electrodes, with each partial electrode being formed in a linear shape, and with the other of the first source electrode and first drain electrode surrounding the partial electrodes; a second output transistor which is formed in the surface portion of the semiconductor substrate, and includes a second source electrode and a second drain electrode located in the first metallic layer, with one of the second source electrode and second drain electrode having one or more partial electrodes, with each partial electrode being formed in a linear shape, and with the other of the source electrode and first drain electrode surrounding the partial electrodes; an output pad placed in a row across the first output transistor on a side opposite the second output transistor; a first connecting wire which is laid in a second metallic layer and electrically connects the output pad and the first drain electrode, with the second metallic layer being located in a level different from that of the first metallic layer; and a second connecting wire which is laid in the second metallic layer and electrically connects the first drain electrode of the first output transistor and the second drain electrode of the second output transistor.

According to this structure, compared to a case of arranging output transistors and an output bonding pad in two rows, it is possible to eliminate a free space within the semiconductor integrated circuit so that a degree of integration can be increased. In addition, using a first drain electrode as an output jumper wire of the second output transistor allows a distance of a signal path between the second drain electrode of the second output transistor and the output bonding pad to be shortest. That is to say, a path for the output signal to be transferred from the second drain electrode to the output bonding pad is made through the second drain electrode of the second output transistor, the second connecting wire, the first drain electrode, the first connecting wire and the output bonding pad. Thus, use of the first drain electrode as a jumper wire that transmits the output signal of the second output transistor does not require formation of an independent wire between the second drain electrode and the output bonding pad. Consequently, a distance of the signal path between the second drain electrode and the output bonding pad is made the shortest. Moreover, either the first and second source electrodes, or the first and second drain electrodes, are formed in a linear shape so that a current-driving capacity of respective first and second output transistors can be enhanced. What is more, a width of respective first and second connecting wires may be formed widely so that two linearly-shaped electrodes are covered, which reduces wiring resistance in the connecting wires.

The semiconductor integrated circuit may further include: a first power wiring which (i) is laid in the second metallic layer to cross the first source electrode and first drain electrode, and (ii) provides, with a first voltage, the first source electrode that is electrically connected to the first power wiring; and a second power wiring which (i) is laid in the second metallic layer to partly cross the second source electrode and second drain electrode, and (ii) provides, with a second voltage, the second source electrode that is electrically connected to the second power wiring.

According to this structure, it is further possible, with use of at least two metallic layers that includes the first and second metallic layers, to place the first power wiring on a part of the first drain electrode, and also to provide the first source electrode with the first voltage. Similarly, using at least such two metallic layers, it is possible to place the second power wiring on a part of the second drain electrode, and also to provide the second source electrode with the second voltage. As a result, it is possible to effectively lay the two metallic layers by reducing as much as possible a wiring space for the second metallic layer.

The semiconductor integrated circuit may further include: a third output transistor which is placed across the output pad on a side opposite to the first output transistor, and includes a third source electrode and a third drain electrode located in the first metallic layer, with one of the third source electrode and third drain electrode having partial electrodes, with each partial electrode being formed in a linear shape, and with the other of the third source electrode and third drain electrode surrounding the partial electrodes; and a third connecting wire which is laid in the first metallic layer and electrically connects the output pad and the third drain electrode.

According to this structure, the first through third output transistors can be arranged in a horizontal row and a distance of a path for an output signal to be transferred from each output transistor can be made shortest. Also, it is possible to effectively lay the two metallic layers by reducing as much as possible a wiring space for the second metallic layer.

The semiconductor integrated circuit may further include: a third output transistor which is placed across the output pad on a side opposite to the first output transistor, and includes a third source electrode and a third drain electrode located in the first metallic layer, with one of the third source electrode and third drain electrode having at least partial electrodes, with each partial electrode being formed in a linear shape, and with the other of the third source electrode and third drain electrode surrounding the partial electrodes; and a third connecting wire which is laid in the second metallic layer and electrically connects the output pad and the third drain electrode.

A layout-width of the semiconductor integrated circuit may correspond to a width of the respective first and second output transistors.

According to this structure, it is possible to minimize a size of a free space allowed in a width direction of the semiconductor integrated circuit within this layout.

The first output transistor may be one of: a first high-side transistor for outputting a high-level signal; and a low-side transistor for outputting a low-level signal, and the second output transistor is the other of the first high-side and low-side transistors.

The semiconductor integrated circuit may further include: a first control circuit unit operable to generate a gate control signal directed to the first output transistor; a second control circuit unit operable to generate a gate control signal directed to the second output transistor; and a pre-driver unit operable to drive the first and second control circuit units, wherein a width of these respective first and second control circuit units and pre-driver unit corresponds to a width of the respective first and second output transistors, and the first and second control circuit units, pre-driver unit, first and second output transistors and output pad are arranged in a row.

According to this structure, a width of each cell corresponds to that of the output transistor so that the free space within the semiconductor integrated circuit can be further reduced. Moreover, in a case of arranging plural semiconductor integrated circuits each of which serves as a cell, an effect of reducing the free space is accumulative to an extent that a degree of integration can be further increased.

The respective first and second output transistors may have a voltage resistance of at least 100V.

According to this structure, the semiconductor integrated circuit can be used as a so-called power transistor that has high current-driving capacity and voltage resistance.

The present invention may be a multi-channel semiconductor integrated circuit that includes: a multi-channel cell array in which a plurality of standard cells are set in an array; a timing generation block which is placed in a central part of a semiconductor chip and is operable to output a timing signal to each of the standard cells; and wirings for transferring the timing signal between the standard cells and the timing generation block, wherein the standard cells are symmetrically placed on both sides of the timing generation block that serves as a center of symmetry, and one standard cell includes: a first output transistor which is formed in a surface portion of a semiconductor substrate, and includes a first source electrode and a first drain electrode located in a first metallic layer, with one of the first source electrode and first drain electrode having partial electrodes, with each partial electrode being formed in a linear shape, and with the other of the first source electrode and first drain electrode surrounding the partial electrodes; a second output transistor which is formed in the surface portion of the semiconductor substrate, and includes a second source electrode and a second drain electrode located in the first metallic layer, with one of the second source electrode and second drain electrode having partial electrodes, with each partial electrode being formed in a linear shape, and with the other of the first source electrode and first drain electrode surrounding the partial electrodes; an output pad placed in a row across the first output transistor on a side opposite to the second output transistor; a first connecting wire which is laid in a second metallic layer and electrically connects the output pad and the first drain electrode, with the second metallic layer being located in a level different from that of the first metallic layer; and a second connecting wire which is laid in the second metallic layer and electrically connects the first drain electrode of the first output transistor and the second drain electrode of the second output transistor.

According to this structure, a multi channel cell array is formed by plural semiconductor integrated circuits (i.e. standard cell), each of which is brought into one line, so that a huge unnecessary free space that appears beneath a conventional circuit block can be greatly reduced. This encourages an increase in a degree of integration in the multi channel semiconductor integrated circuit. What is more, plural standard cells are symmetrically arranged on both sides of the circuit block, so that it is possible to minimize an unbalance among lengths of wirings for transmitting a timing signal from the circuit block to the standard cells, and also to reduce a variation in delay characteristics.

The multi-channel semiconductor integrated circuit may further include: a first power wiring which (i) is laid in the second metallic layer to cross the first source electrode and first drain electrode, and (ii) provides, with a first voltage, the first source electrode that is electrically connected to the first power wiring; and a second power wiring which (i) is laid in the second metallic layer to partly cross the second source electrode and second drain electrode, and (ii) provides, with a second voltage, the second source electrode that is electrically connected to the second power wiring, wherein each of the first and second power wirings are straightly laid.

According to this structure, the first and second power wirings can be connected to plural standard cells via straight, that is, shortest, wirings.

The multi-channel semiconductor integrated circuit may further include at least two ground potential wirings laid along at least two sides of the timing generation block, with each wiring being operable to transfer a ground potential.

According to this structure, a ground potential wiring can reduce influence caused by crosstalk from the circuit block to the standard cell or noise.

The multi-channel semiconductor integrated circuit may further include: a first pad having a ground potential and placed at one end within the semiconductor chip; and a second pad having a ground potential and placed at another end within the semiconductor chip, wherein one of the first and second power wirings is a ground potential wiring and is connected to the first and second pads.

Such structure encourages reduction of impedance of ground potential wiring that finalizes a low level of the output transistor for outputting a low level signal, within each standard cell. Therefore, it is possible to further prevent influence caused by noise and stabilize output characteristics.

As described above, according to the semiconductor integrated circuit of the present invention, the free space within the semiconductor integrated circuit can be eliminated, so that a degree of integration can be increased. Since variation in a length of an output signal wire that is laid from each output transistor to the output pad can be reduced to a minimum degree, it is possible to minimize variation among each delay time in outputting a signal within the semiconductor integrated circuit.

According to the multi-channel semiconductor integrated circuit of the present invention, arranging plural semiconductor integrated circuits in a row, with each circuit serving as a cell, accumulatively takes effects in reducing an amount of the free space, and thus, a degree of integration can be further increased. An unbalance in lengths of each wiring that transfers a timing signal from the timing generation block to each of the standard cells can be minimized, and thereby it is possible to reduce a variation in a delay characteristic. Further, the ground potential wiring can reduce influence made by crosstalk and noise from the timing generation block to each standard cell. What is more, it is possible to reduce impedance of the ground potential wiring that finalizes a low level of the output transistor for outputting a low level from each standard cell, to prevent influence made by noise, and to stabilize an output characteristic.

Further Information about Technical Background to this Application

The disclosure of Japanese Patent Application No. 2004-163700 filed on Jun. 1, 2004 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DETAILED DESCRIPTION OF THE PREFERRED EMBODIMENT(S)

Figure 1:
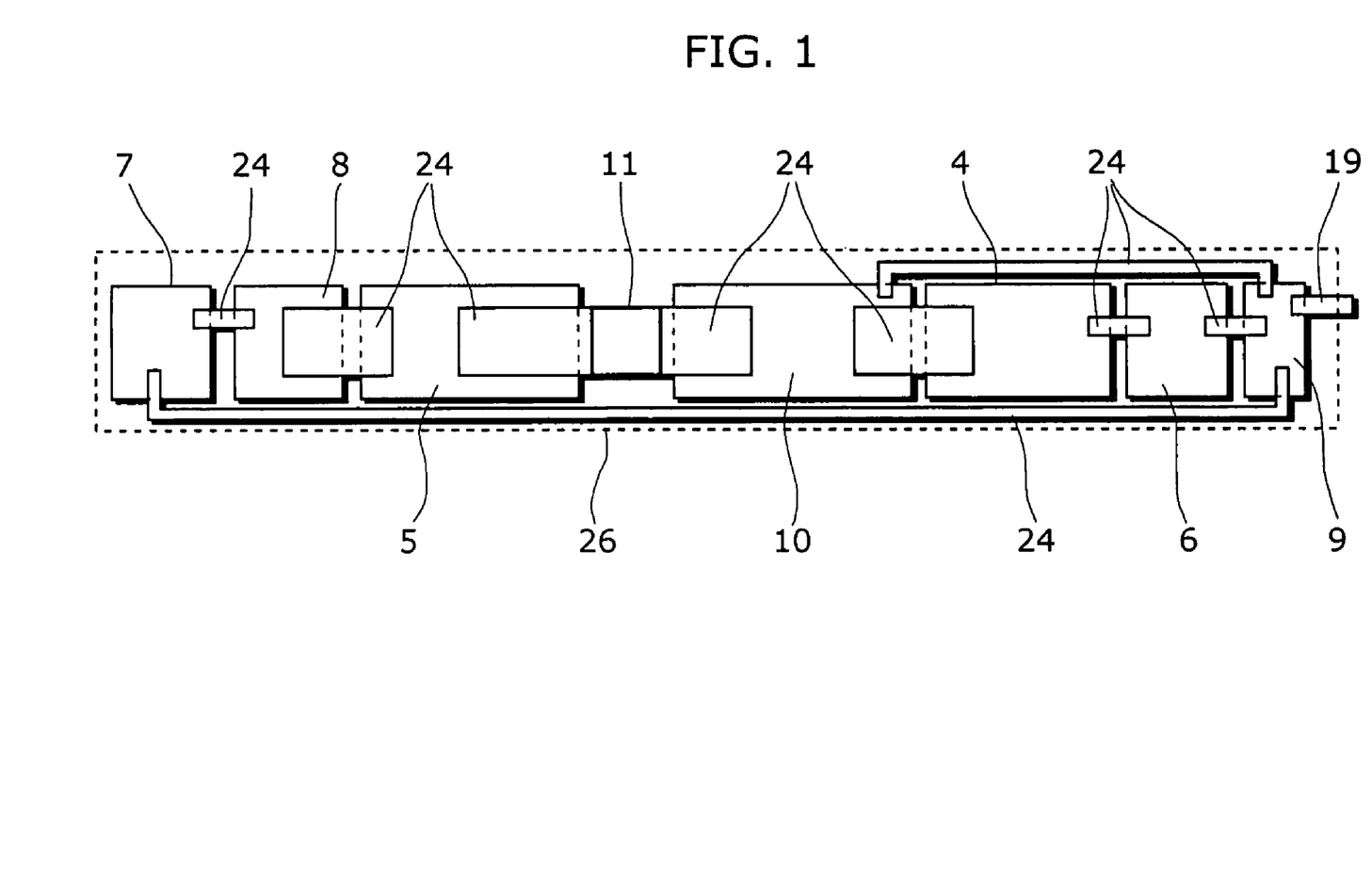
FIG. 1 is a plan view showing a structure of a ternary circuit according to the present invention.

FIG. 1 is a plan view showing a structure of a ternary circuit used for a semiconductor integrated circuit according to the present invention. The ternary circuit shown in this figure is equivalent to the ternary circuit shown in FIG. 7. The ternary circuit cell shown in FIG. 1 can be used as a standard cell. The ternary circuit shown in FIG. 1 includes: a first high-side transistor 4 for high-level output; a second high-side transistor 5 for middle-level output; a diode 8 for backflow prevention; a low-side transistor 10 for low-level output; a first level shift circuit 6 that outputs a high-level output control signal; a second level shift circuit 7 that outputs a middle-level output control signal; a pre-driver 9 that controls the first and second level shift circuits and the low-side transistor 10; an output bonding pad 11; and an input wiring 19 for providing the pre-driver 9 with a trigger signal. Each of the first high-side transistor 4, the second high-side transistor 5 and the low-side transistor 10 is a power transistor having a DMOS structure, and has a current-driving capacity of at least 100 mA. Moreover, in a case of using a power transistor intended for PDP driving for each of the output transistors, a power transistor with a strength of at least 100V shall be used.

In FIG. 1, each circuit component is brought into one line in a horizontal direction, as a cell. With such single-row placement, it is possible to eliminate free space 38 in a semiconductor integrated circuit. A layout-width of the semiconductor integrated circuit corresponds to a cell width of respective output transistors; namely, the first high-side transistor 4, the second high-side transistor 5, the low-side transistor 10, and the like. That is to say that the layout-width of the semiconductor integrated circuit is almost the same as a width of the output transistor. To be more concrete, the layout-width of the semiconductor integrated circuit is determined by adding, to the width of the output transistor, a certain amount of portion for wiring.

In this layout of the ternary circuit, the second high-side transistor 5 is placed immediately on the left side of the output bonding pad 11, followed by the diode 8 and the second level shift circuit 7, which are sequentially placed towards left. On the right side of the output bonding pad 11, the low-side transistor 10, the first high-side transistor 4, the first level shift circuit 6 and the pre-driver 9 are sequentially placed towards right. With such placement, it is possible to minimize variation in length of wiring for an output signal wire that connects each transistor and each output bonding pad and variation in a delay time in outputting an output signal within the semiconductor integrated circuit.

The first level shift circuit 6, the second level shift circuit 7 and the pre-driver 9 are designed so that each width thereof is set according to a cell width of the low-side transistor 10, which is a largest width of all the transistors. Thus, in the conventional layout, the cells in the standard cell 26 are placed in two rows as shown in FIG. 5, which results in generation of unnecessary free space 38 beneath the cell of the pre-driver 9, whereas in the present invention, the cells are arranged in one row so that unnecessary free space 38 can be eliminated and a degree of integration can be increased.

Figure 2:
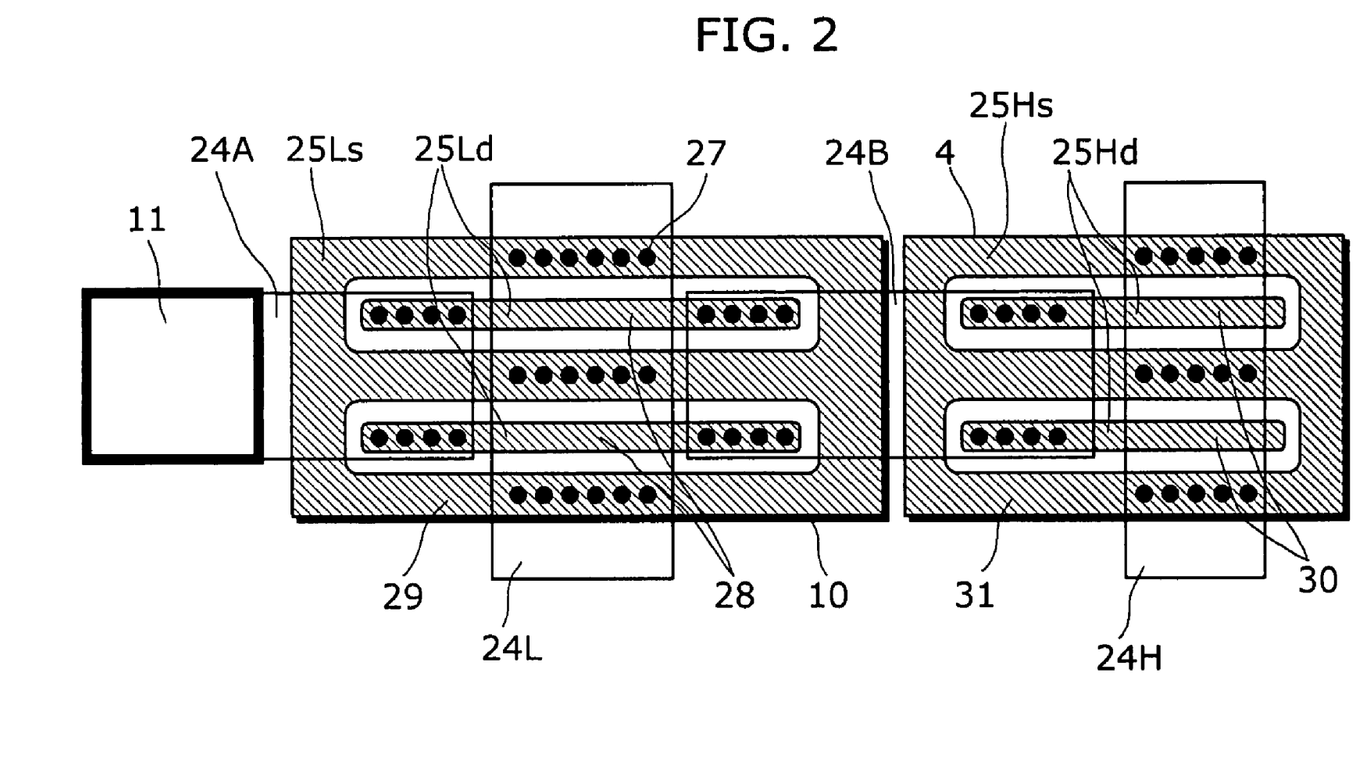
FIG. 2 is a plan view of a magnified part of a low-side transistor in the ternary circuit.
Figure 3:
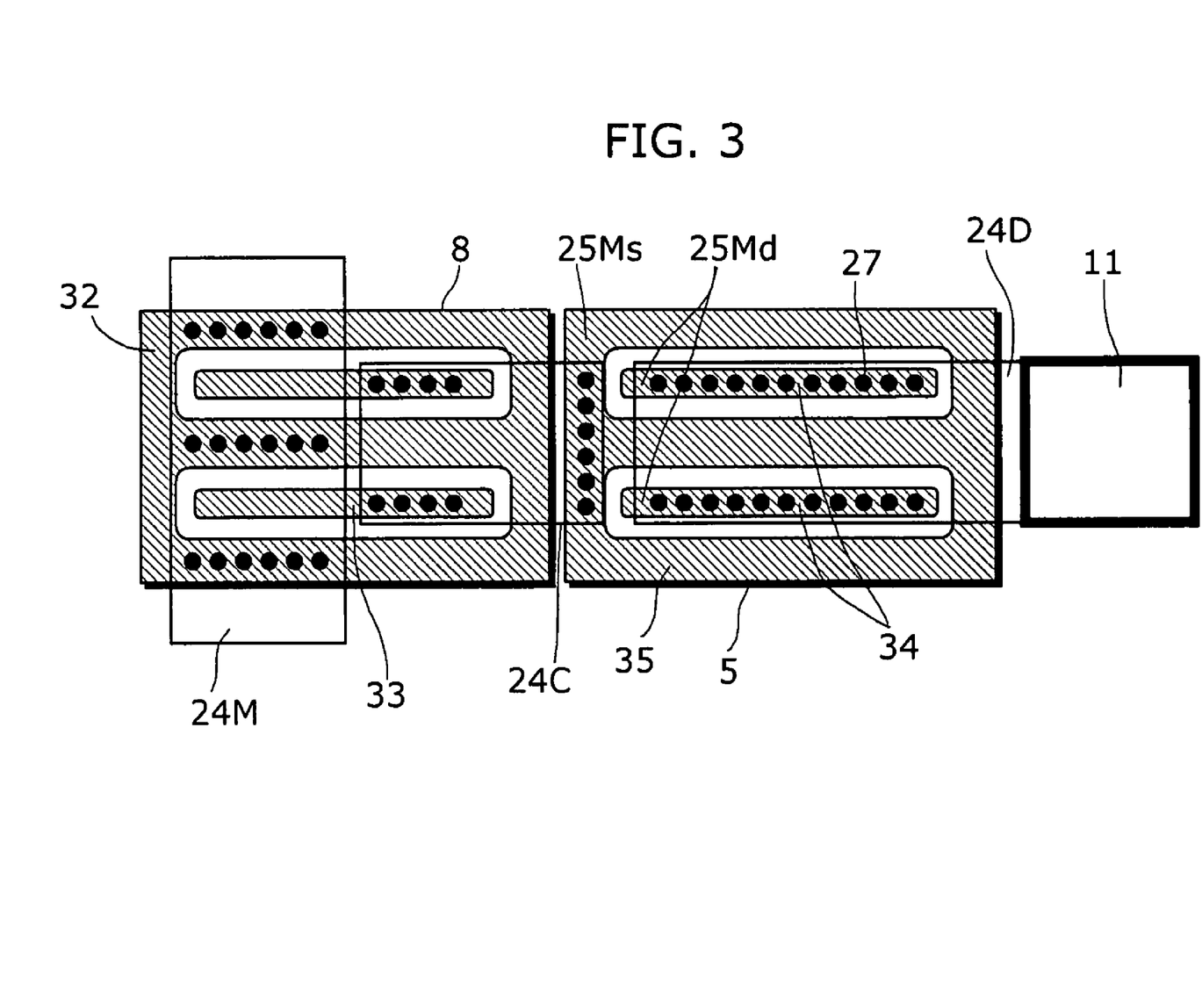
FIG. 3 is a plan view of a magnified part of a second high-side transistor in the ternary circuit.

FIG. 2 is a plan view of a magnified part of a periphery of the low-side transistor 10 in the ternary circuit show in FIG. 1. FIG. 3 is a plan view of a magnified part of the second high-side transistor 5 in the ternary circuit shown in FIG. 1. A cross-hatched area in FIGS. 2 and 3 indicates a first metallic layer. The first metallic layer is isolated by a dielectric film and a second metallic layer being a layer different from the first metallic layer, and is electrically connected to the second metallic layer via a through hole (hereinafter to be referred to as "contact") 27. A second metallic layer 24L that is laid on the low-side transistor 10 serves as a ground potential wiring while a second metallic layer 24H laid on the first high-side transistor 4 serves as a first-high voltage wiring for outputting high-level signals. The second metallic layer 24M on the diode 8 is a second-high voltage wiring for outputting middle-level signals. (25) denotes the first metallic layer while (24) denotes the second metallic layer. The first letters such as "L", "M" and "H" attached to (24) and (25) respectively represent "low level", "middle level" and "high level". The second letters such as "s" and "d" following the first letter respectively represent "source" and "drain".

The low-side transistor 10 is formed in a surface of a semiconductor substrate. A source electrode 25Ls is located in the first metallic layer on a source region 29 of the low-side transistor 10. A drain electrode 25Ld is located in the first metallic layer on a drain region 28 of the low-side transistor 10. The drain electrode 25Ld is surrounded by the source electrode 25Ls on the semiconductor substrate. The drain region 28 in the low-side transistor 10 is surrounded by the source region 29 in the low-side transistor 10. The drain electrode 25Ld is made up of two partial electrodes, each of which is formed in a linear shape. Each of the partial electrodes is surrounded by the source electrode 25Ls on the semiconductor substrate. The drain electrode 25L is an electrode for outputting low-level signals normally, and is also used, in the present embodiment, as a path (i.e. jumper wire) for transferring high-level signals.

The first high-side transistor 4 is formed also in the surface of the semiconductor substrate. A source electrode 25Hs is located in the first metallic layer on a source region 31 of the first high-side transistor 4. A drain electrode 25Hd is located in the first metallic layer on a drain region 30 of the first high-side transistor 4. The drain electrode 25Hd is surrounded by the source electrode 25Hs on the semiconductor substrate while the drain electrode 30 is surrounded by the source region 31. The drain electrode 25Hd is made up of two partial electrodes, each of which is formed in a linear shape. Each of these partial electrodes is surrounded by the source electrode 25Hs on the semiconductor substrate.

The output bonding pad 11 is normally located in the first and second metallic layers, but at least in a metallic layer that is a top layer of the semiconductor integrated circuit. The output bonding pad 11 is arranged in a row across the low-side transistor 10 on a side opposite to the first high-side transistor 4.

A connecting wire 24A is laid in the second metallic layer and is extended from the output bonding pad 11 to an end of the drain electrode 25Ld on a side of the output bonding pad 11. The second metallic layer is a layer different from the first metallic layer and is isolated from the first metallic layer. The connecting wire 24A is electrically connected, via contacts 27, to an end of the drain electrode 25Ld on the side of the output bonding pad 11. The connecting wire 24A is used for transferring not only a high-level signal but also a low-level signal, to the output bonding pad 11.

A connecting wire 24B is laid in the second metallic layer and is extended from an end of the drain electrode 25Ld on a side of the first high-side transistor 4 to an end of the drain electrode 25Hd on a side of the low-side transistor 10. The connecting wire 24B is electrically connected, via contacts 27, to the end of the drain electrode 25Ld on the side of the first high-side transistor 4, and also to the end of the drain electrode 25Hd on the side of the low-side transistor 10.

A power wiring 24L is laid in the second metallic layer to cross the source electrode 25Ls and the drain electrode 25Ld in a vertical direction. The power wiring 24L is electrically connected, via contacts 27, to the source electrode 25Ls for providing the source electrode 25Ls with a first voltage (low-level).

A power wiring 24H is laid in the second metallic layer to cross the source electrode 25Hs and the drain electrode 25Hd in a vertical direction. The power wiring 24H is electrically connected, via contacts 27, to the source electrode 25Hs for providing the source electrode 25Hs with a second voltage (high-level).

The second high-side transistor 5 is placed across the output bonding pad 11 on the side opposite to the low-side transistor 10.

The source electrode 25Ms is located in the first metallic layer on a source region 35 of the second high-side transistor 5. A drain electrode 25Md is located in the first metallic layer on a drain region 34 of the second high-side transistor 5, and a third drain electrode is surrounded by a third source electrode on the semiconductor substrate. The drain region 34 of the second high-side transistor 5 is surrounded by the source region 35 of the second high-side transistor 5 in the surface of the semiconductor substrate. That is to say that the drain electrode 25Md is made up of two partial electrodes, each of which is formed in a linear shape. Each of the partial electrodes is surrounded by the source electrode 25Ms formed on the semiconductor substrate.

A connecting wire 24C is laid in the second metallic layer and is extended from the output bonding pad 11 to an end of the drain electrode 25Md on the side of the output bonding pad 11. Such connecting wire 24C is electrically connected, via contacts 27, to the end of the drain electrode 25Md on the side of the output bonding pad 11.

Thus, as in the low-side transistor 10 shown in FIG. 2, the source electrode 25Ls is connected to the power wiring 24L that serves as a ground potential wiring, while the drain electrode 25Ld is connected to the output bonding pad 11 via the power wiring 24A that serves as an output signal wire. A control signal wire drawn from the pre-driver 9 is connected to a gate region.

In the first high-side transistor 4, the source electrode 25Hs is connected to the power wiring 24H that serves as a first-high voltage wiring, while the drain electrode 25Hd is connected to the drain electrode 25Ld of the low-side transistor 10 via the power wiring 24B that serves as an output signal wire. Thus, an output signal from the drain electrode 25Hd of the first high-side transistor 4 is transmitted to the output boding pad 11 via the two drain electrodes 25Ld located immediately below the power wiring 24L laid in the second metallic layer. In other words, when the first high-side transistor 4 is on, a high-level output signal from the first high-side transistor 4 is outputted from the output bonding pad 11 sequentially through the drain electrode 25Hd of the first high-side transistor 4, the connecting wire 24B, the drain electrode 25Ld of the low-side transistor 10 and the connecting wire 24A. In this way, the drain electrode 25Ld of the low-side transistor 10 is used as a jumper wire not only for outputting low-level signals but also for transferring high-level output signals. As a result, a number of wirings used as output signal wires directed to the output bonding pads 11 is reduced, and a degree of integration can be increased.

In the cell of the second high-side transistor 5 shown in FIG. 3, the source electrode 25Ms is connected, via the diode 8, to a power wiring 24M that serves as a second-high voltage wiring, while the drain electrode 25Md is connected to the output bonding pad 11 via the power wiring 24D that serves as an output signal wire.

Note that in the circuit structure shown in FIG. 7, the ternary output circuit operates normally even in a case where a series circuit made up of the diode 8 and the second high-side transistor 5 has a different structure in which the diode 8 and the second high-side transistor 5 are placed vice versa. In such case, the diode 8 and the second high-side transistor 5 shown in FIGS. 1 and 3 may be placed vice versa according to such structure.

Figure 4A:
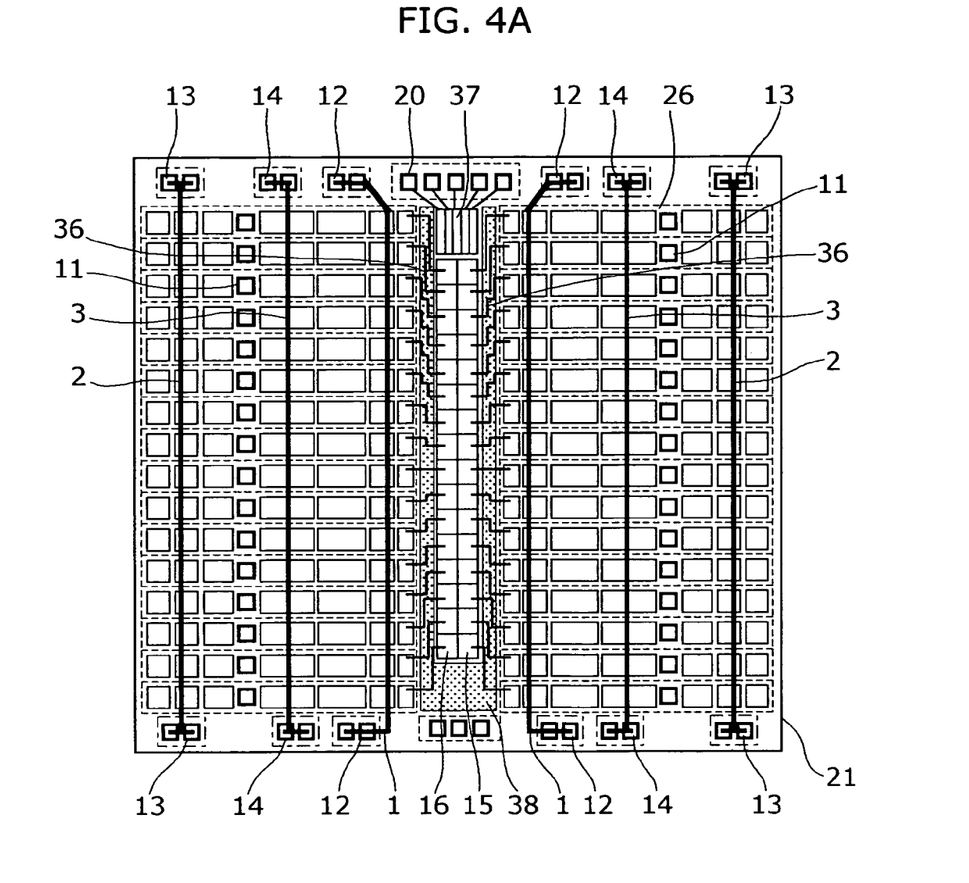
FIG. 4A is a plan view showing a structure of a multi-channel semiconductor integrated circuit based on the ternary circuit, according to the present invention.

FIG. 4A is a plan view showing a structure of a multi-channel semiconductor integrated circuit based on the ternary circuit, according to an embodiment of the present invention. Such multi-channel semiconductor integrated circuit is made by forming, on a semiconductor chip 21, a first high voltage supply wiring 1, a second high voltage power supply 2, a ground potential wiring 3, a first-high voltage terminal 12, a second-high voltage terminal 13, a ground terminal 14, timing generation block 15, timing generation unit cell 16, input control terminal 20, a serge protection device, and an array of standard cells 26.

In this layout of the present multi-channel semiconductor integrated circuit, the ternary circuit shown in FIG. 1 is used as the standard cell 26. In a center of the semiconductor chip 21, the timing generation block 15 is placed. The timing generation block 15 is an assembly of timing generation unit cells 16, each of which includes an input control circuit, a shift register that controls timing of output, and a latch circuit for holding output. The timing generation unit cells 16 are placed as many as a number of the standard cells 26. The timing generation block 15 functions, for example, as a shift register for controlling timing of a trigger signal sent to each pre-driver 9 and timing of an output from each standard cell 26, according to a control signal from the input control terminal 20. An output from each timing generation unit cell 16 is connected, via wiring, to input terminal 19 in a corresponding standard cell 26, as shown in FIG. 4A. In this case, each of the standard cells 26 sequentially outputs a pulse waveform as triggered by a shift operation performed by the timing generation block 15, and operates as a control circuit in a display apparatus such as a Plasma Display Panel (PDP). For example, in a case of negative logic, a pulse is normally outputted at high-level, but due to control performed by the pre-driver 9 receiving a trigger signal, the pulse falls to low-level for a period of time t1, then raised to middle-level for a period of time t2, and raises back to high-level.

As shown in FIG. 4A, a block of the standard cells 26 is symmetrically placed on each side across the timing generation block 15 so that the pre-driver 9 and the timing generation unit cell 16 are placed next to each other. The timing generation unit cell 16 and the pre-driver 9 are connected via a bus wiring 36. Ground terminals (bonding pads) 14 are placed so that two ground terminals are located at a top end and another two at a bottom end in a vertical direction of the integrated chip 21, and ground potential wiring 3 (the power wiring 24L in FIG. 2) is laid on the low-side transistor 4 in the standard cell 26 so that the two ground terminals 14 placed in the top end are connected to the two ground terminals 14 placed in the bottom end within the semiconductor chip 21.

In the present embodiment, an internal structure of the standard cell 26 (i.e. ternary circuit) placed within the semiconductor chip applies a single-row placement shown in FIG. 1, instead of the two-row placement shown in FIG. 5 which is used in the conventional art. Even in a case where a number of standard cells 26 to be placed increases, application of the single-row placement reduces an increase in a planar dimension of the semiconductor chip in a vertical direction, as can be seen in the conventional layout shown in FIG. 6. This minimizes a size of unnecessary free space 38 that appears beneath the timing generation block 15, so that a degree of integration of a multi-channel semiconductor integrated circuit can be increased. There being almost no increase in a vertical direction of the semiconductor chip 21, a variation in lengths of bus wirings 36, each connecting the pre-driver 9 and the timing generation unit cell 16, and a variation in a delay time of each output channel, are both reduced. Thus, unbalance among output characteristics caused by such delay time can be reduced.

In the present invention, the ground terminals 14 are placed so that one is located at the top end and the other at the bottom end in a vertical direction of the integrated chip, and the ground potential wiring 3 is laid on the low-side transistor 4 in the standard cell 26 so that the ground terminal 14 placed in the top end within the semiconductor chip is connected to the ground terminal 14 placed in the bottom end within the semiconductor chip. These respective terminals 14 are connected to a package in the semiconductor chip 21 by performance of wire bonding so that potentials of the ground terminals 14 are stable. Thus, impedance of the ground potential wiring 3 can be reduced, so that even in a case where an output of each channel has a huge current, a ground potential of respective standard cells 26 are stabilized and similar output characteristics can be obtained through the standard cells 26.

Figure 4B:
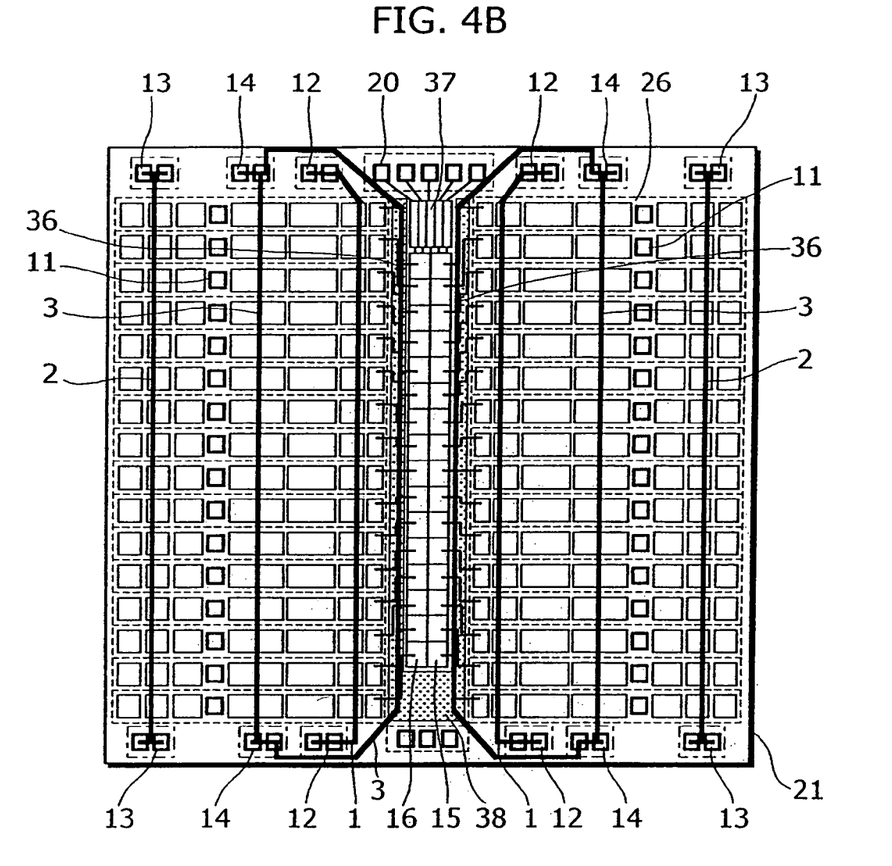
FIG. 4B is a plan view showing another structure of the multi-channel semiconductor integrated circuit based on the ternary circuit, according to the present invention.

Note that, as shown in FIG. 4B, the timing generation block 15 may be surrounded by the ground potential wiring 3 in three directions except for a direction facing the input control terminal 20. The ground potential wiring 3 may be wired on both sides of the timing generation block 15. The ground potential wiring 3 serves as a shielding for preventing external noise from being transmitted from the output bonding pad 11 to the timing generation block 15 through the standard cell 26. As a result, a signal inputted from the timing generation block 15 to each pre-driver 9 is rendered stable and so are output characteristics in each standard cell 26.

The present invention can be applied equally to a binary circuit as to the ternary circuit as described above. In such case, among circuit components shown in FIG. 7, the second-high voltage terminal 13, the diode 8, the second high-side transistor 5 and the second level shift circuit 7 may be deleted so as to form a structure of the binary circuit. Similarly, cells equivalent to these circuit components may be deleted from the structure shown in FIG. 1. Moreover, the output bonding pad 11 may be placed between the first high-side transistor 4 and the low-side transistor 10.

Note that, each of the output transistors shown in FIGS. 1 through 3 shows that a drain electrode is made up of two partial electrodes, each of which is formed in a linear shape; however, a number of linearly-shaped partial electrodes may be one, or three or greater. The number may be determined according to a driving capacity required of each output transistor.

Moreover, this layout also shows that a drain electrode is formed in a linear shape and is surrounded by a source electrode; however, it may be vice versa. That is to say that a source electrode may be linearly formed and be surrounded by a drain electrode. In such case, a number of linearly-shaped partial electrodes may be one or greater.

The layout further shows that two layers, that is, the first metallic layer 25 and the second metallic layer 24, are indicated as wiring layers; however, a number of wiring layers may be three or greater. In the layout, the second metallic layer 24 is placed higher than the first metallic layer 25; however, placement of the layers may be vice versa. The first metallic layer 24 and the second metallic layer 25 only need to be different from each other and they may be placed at any level relative to one another.

Note also that in the above embodiments, the first metallic layer 25 and the second metallic layer 24 shall not be limited to aluminum wirings, and they may be made of aluminum alloy, copper, copper alloy, or the like.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The present invention is applicable to the following circuits: a semiconductor integrated circuit that includes output transistors and an output bonding pad connected to an output signal wire drawn from each of the output transistors; and a multi-channel semiconductor integrated circuit in which a plurality of semiconductor integrated circuits, each of which serves as a standard cell, are placed. An example of such multi-channel semiconductor integrated circuit is a binary circuit, a ternary circuit, and a drive circuit in a display apparatus such as a Plasma Display Panel (PDP).

What is claimed is:

1. A semiconductor integrated circuit comprising an output circuit including:

a first output transistor having a first source electrode electrically connected to a first power terminal;

a second output transistor having a second drain electrode electrically connected to a first drain electrode of said first transistor, and having a second source electrode connected to a ground terminal; and an output bonding pad having an output terminal which is a connection point to which the first drain electrode and the second drain electrode are commonly connected, wherein said first output transistor is in a surface portion of a semiconductor substrate and including a first source electrode and a first drain electrode in a first metallic layer, with one of said first source electrode and first drain electrode having first linear partial electrodes, and with the other of said first source electrode and first drain electrode surrounding said first linear partial electrodes;

said second output transistor is in said surface portion of said semiconductor substrate and including a second source electrode and a second drain electrode in said first metallic layer, with one of said second source electrode and second drain electrode having second linear partial electrodes, and with the other of said second source electrode and second drain electrode surrounding said second linear partial electrodes, and said second output transistor being positioned next to said first output transistor; and said output bonding pad is positioned in a row with said first output transistor and said second output transistor such that said first output transistor is between said output bonding pad and said second output transistor, and said first output transistor being positioned next to said output bonding pad;

wherein said output circuit further includes:

a first connecting wire in a second metallic layer and electrically interconnecting said output bonding pad and said first drain electrode; and a second connecting wire in said second metallic layer and electrically interconnecting said first drain electrode and said second drain electrode, wherein said first metallic layer and said second metallic layer are at different levels, respectively.

2. The semiconductor integrated circuit according to claim 1, further comprising:

a first power wiring in said second metallic layer and crossing said first source electrode and first drain electrode, said first power wiring being electrically connected to said first source electrode, and said first power terminal and said first source electrode being electrically connected by said first power wiring, so as to provide said first source electrode with a first voltage; and a second power wiring in said second metallic layer and crossing said second source electrode and second drain electrode, said second power wiring being electrically connected to said second source electrode, and said ground terminal and said second source electrode being connected by said second power wiring, so as to provide said second source electrode with a second voltage.

3. The semiconductor integrated circuit according to claim 2, wherein said output circuit further includes:

a third output transistor having a third source electrode electrically connected to a second power terminal and a third drain electrode electrically connected to the output bonding pad, and is positioned such that said output bonding pad is between said first output transistor and said third output transistor, said third output transistor including the third source electrode and the third drain electrode in said first metallic layer, with one of said third source electrode and third drain electrode having third linear partial electrodes, and with the other of said third source electrode and the third drain electrode surrounding said third linear partial electrodes; and a third connecting wire in said first metallic layer and electrically interconnecting said output bonding pad and said third drain electrode.

4. The semiconductor integrated circuit according to claim 1, further comprising:

wherein said output circuit further includes:

a third output transistor having a third source electrode electrically connected to a second power terminal and a third drain electrode electrically connected to the output bonding pad, and is positioned such that said output bonding pad is between said first output transistor and said third output transistor, said third output transistor including the third source electrode and the third drain electrode in said first metallic layer, with one of said third source electrode and third drain electrode having third linear partial electrodes, and with the other of said third source electrode and the third drain electrode surrounding said third linear partial electrodes; and a third connecting wire in said first metallic layer and electrically interconnecting said output bonding pad and said third drain electrode.

5. The semiconductor integrated circuit according to claim 4, further comprising:

a first control circuit unit operable to generate a gate control signal directed to said first output transistor;

a second control circuit unit operable to generate a gate control signal directed to said second output transistor; and a third control circuit unit operable to generate a gate control signal directed to said third output transistor;

wherein a width of said first, second and third control circuit units corresponds to a width of said first, second and third output transistors, and wherein said first and second control circuit units and said third output transistor are positioned in the row with said first and second output transistors and said output bonding pad.

6. The semiconductor integrated circuit according to claim 1, wherein a layout-width of the semiconductor integrated circuit corresponds to a width of said first and second output transistors.

7. The semiconductor integrated circuit according to claim 1, wherein said first output transistor comprises one of a high-side transistor for outputting a high-level signal and a low-side transistor for outputting a low-level signal, and said second output transistor comprises the other of said high-side transistor and said low-side transistor.

8. The semiconductor integrated circuit according to claim 1, further comprising:

a first control circuit unit operable to generate a gate control signal directed to said first output transistor; and a second control circuit unit operable to generate a gate control signal directed to said second output transistor;

wherein a width of said first and second control circuit units corresponds to a width of said first and second output transistors, and wherein said first and second control circuit units are positioned in the row with said first and second output transistors and said output bonding pad.

9. The semiconductor integrated circuit according to claim 1, wherein said first and second output transistors each have a voltage resistance of at least 100V.

10. The semiconductor integrated circuit according to claim 1, wherein said first output transistor outputs a signal in a first logic level and said second output transistor outputs a signal in a second logic level, the first and the second logic levels being different from each other.

11. A semiconductor device comprising a standard cell which outputs a signal in one of at least two logic levels, wherein said standard cell includes:

an output circuit including:

a first output transistor having a first source electrode electrically connected to a first power terminal;

a second output transistor having a second drain electrode electrically connected to a first drain electrode of said first transistor, and having a second source electrode connected to a ground terminal; and an output bonding pad having an output terminal which is a connection point to which the first drain electrode and the second drain electrode are commonly connected, wherein said first output transistor is in a surface portion of a semiconductor substrate and including a first source electrode and a first drain electrode in a first metallic layer, with one of said first source electrode and first drain electrode having first linear partial electrodes, and with the other of said first source electrode and first drain electrode surrounding said first linear partial electrodes;

said second output transistor is in said surface portion of said semiconductor substrate and including a second source electrode and a second drain electrode in said first metallic layer, with one of said second source electrode and second drain electrode having second linear partial electrodes, and with the other of said second source electrode and second drain electrode surrounding said second linear partial electrodes, and said second output transistor being positioned next to said first output transistor;

said output bonding pad is positioned in a row with said first output transistor and said second output transistor such that said first output transistor is between said output bonding pad and said second output transistor, and said first output transistor being positioned next to said output bonding pad, said output circuit further includes:

a first connecting wire in a second metallic layer and electrically interconnecting said output bonding pad and said first drain electrode; and a second connecting wire in the second metallic layer and electrically interconnecting said first drain electrode of said first output transistor and said second drain electrode of said second output transistor, wherein said first metallic layer and said second metallic layer are at different levels, respectively, and said first output transistor outputs a signal in a logic level different from a logic level of a signal outputted by said second output transistor.

12. A semiconductor device comprising an array of a plurality of standard cells, wherein each of said standard cells includes:

an output circuit including:

a first output transistor having a first source electrode electrically connected to a first power terminal;

a second output transistor having a second drain electrode electrically connected to a first drain electrode of said first transistor, and having a second source electrode connected to a ground terminal; and an output bonding pad having an output terminal which is a connection point to which the first drain electrode and the second drain electrode are commonly connected, wherein said first output transistor is in a surface portion of a semiconductor substrate and including a first source electrode and a first drain electrode in a first metallic layer, with one of said first source electrode and first drain electrode having first linear partial electrodes, and with the other of said first source electrode and first drain electrode surrounding said first linear partial electrodes;

said second output transistor is in said surface portion of said semiconductor substrate and including a second source electrode and a second drain electrode in said first metallic layer, with one of said second source electrode and second drain electrode having second linear partial electrodes, and with the other of said second source electrode and second drain electrode surrounding said second linear partial electrodes, and said second output transistor being positioned next to said first output transistor;

said output bonding pad is positioned in a row with said first output transistor and said second output transistor such that said first output transistor is between said output bonding pad and said second output transistor, and said first output transistor being positioned next to said output bonding pad, said output circuit further includes:

a first connecting wire in a second metallic layer and electrically interconnecting said output bonding pad and said first drain electrode; and a second connecting wire in the second metallic layer and electrically interconnecting said first drain electrode of said first output transistor and said second drain electrode of said second output transistor, and wherein said first metallic layer and said second metallic layer are at different levels, respectively.

13. The semiconductor device according to claim 12, further comprising:

a timing generation block in a central part of a semiconductor chip and operable to output a timing signal to each of said standard cells; and wiring for transferring the timing signal between said standard cells and said timing generation block, wherein said standard cells are symmetrically placed on opposite sides of said timing generation block such that said timing generation block serves as a center of symmetry.

14. The multi-channel semiconductor integrated circuit according to claim 13, wherein said semiconductor integrated circuit constituting said each of said standard cells further includes (vi) a first power wiring in said second metallic layer and crossing said first source electrode and first drain electrode, said first power wiring being electrically connected to said first source electrode so as to provide said first source electrode with a first voltage, and (vii) a second power wiring in said second metallic layer and crossing said second source electrode and second drain electrode, said second power wiring being electrically connected to said second source electrode so as to provide said second source electrode with a second voltage, with said first power wiring and said second power wiring each extending straightly.

15. The multi-channel semiconductor integrated circuit according to claim 13, further comprising:

a first pad having a ground potential and located at one end within said semiconductor chip; and a second pad having a ground potential and located at another end within said semiconductor chip, wherein one of said first power wiring and said second power wiring comprises a ground potential wiring and is connected to said first and second pads.

16. The multi-channel semiconductor integrated circuit according to claim 13, wherein said semiconductor integrated circuit constituting said each of said standard cells further includes (viii) a third output transistor positioned such that said output bonding pad is between said first output transistor and said third output transistor, said third output transistor including a third source electrode and a third drain electrode in said first metallic layer, with one of said third source electrode and third drain electrode having third linear partial electrodes, and with the other of said third source electrode and third drain electrode surrounding said third linear partial electrodes, and (ix) a third connecting wire in said first metallic layer and electrically interconnecting said output bonding pad and said third drain electrode.

17. The multi-channel semiconductor integrated circuit according to claim 13, wherein
   said first output transistor comprises one of a first high-side transistor for outputting a high-level signal, a second high-side transistor for outputting a middle-level signal, and a low-side transistor for outputting a low-level signal,
   said second output transistor comprises another of said first high-side transistor, said second high-side transistor, and said low-side transistor, and
   said third output transistor comprises the other of said first high-side transistor, said second high-side transistor, and said low-side transistor.

18. The multi-channel semiconductor integrated circuit according to claim 13, further comprising:
   at least two ground potential wires along at least two sides of said timing generation block, with each of said at least two ground potential wires being operable to transfer a ground potential.

19. The multi-channel semiconductor integrated circuit according to claim 13, wherein
   the array of said standard cells is operable to generate a scanning signal for use by a display apparatus.

20. The multi-channel semiconductor integrated circuit according to claim 13, wherein
   said first and second output transistors each have a voltage resistance of at least 100V.

* * * * *